(12) United States Patent
Chang et al.

(10) Patent No.: US 12,389,618 B2
(45) Date of Patent: Aug. 12, 2025

(54) SEMICONDUCTOR TRANSISTOR DEVICE INCLUDES BACKSIDE VIA ELECTRICALLY CONNECTING EPITAXIAL SOURCE/DRAIN STRUCTURES AND METHOD FOR FORMING THE SAME

(71) Applicant: TAIWAN SEMICONDUCTOR MANUFACTURING COMPANY, LTD., Hsinchu (TW)

(72) Inventors: Lo-Heng Chang, Hsinchu (TW); Li-Zhen Yu, New Taipei (TW); Lin-Yu Huang, Hsinchu (TW); Huan-Chieh Su, Changhua County (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 549 days.

(21) Appl. No.: 17/869,115

(22) Filed: Jul. 20, 2022

(65) Prior Publication Data

US 2024/0030316 A1    Jan. 25, 2024

(51) Int. Cl.
*H10D 30/01* (2025.01)
*H10D 30/67* (2025.01)
*H10D 62/10* (2025.01)
*H10D 64/01* (2025.01)

(52) U.S. Cl.
CPC ....... *H10D 30/024* (2025.01); *H10D 30/6735* (2025.01); *H10D 62/121* (2025.01); *H10D 64/017* (2025.01)

(58) Field of Classification Search
CPC ............ H10D 30/6735; H10D 30/024; H10D 30/797; H10D 62/121; H10D 64/017; H10D 30/6757; H10D 62/822; H10D 64/254

See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

*Primary Examiner* — Changhyun Yi
(74) *Attorney, Agent, or Firm* — Birch, Stewart, Kolasch & Birch, LLP

(57) ABSTRACT

A method includes forming a semiconductor strip and semiconductor layers vertically stacked over a front side of the semiconductor strip; forming a gate structure over the semiconductor layers; etching the semiconductor strip to form recesses in the semiconductor strip and on opposite sides of the gate structure; forming epitaxial layers in the recesses, respectively; forming isolation layers over the epitaxial layers, respectively; forming epitaxial source/drain structures over the isolation layers, respectively; performing an etching process from a backside of the semiconductor strip to form a via opening extending through the semiconductor strip, one of the epitaxial layer, and one of the isolation layer, wherein one of the epitaxial source/drain structures is exposed through the via opening; and forming a backside via in the via opening.

20 Claims, 16 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0378842 A1* | 12/2019 | Reznicek ............... H10B 12/05 |
| 2023/0187551 A1* | 6/2023 | Cheng ................ H01L 23/5286 |
| | | 257/369 |
| 2023/0215767 A1* | 7/2023 | Xie ........................ H10D 30/43 |
| | | 257/329 |

* cited by examiner

SEMICONDUCTOR TRANSISTOR DEVICE INCLUDES BACKSIDE VIA ELECTRICALLY CONNECTING EPITAXIAL SOURCE/DRAIN STRUCTURES AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
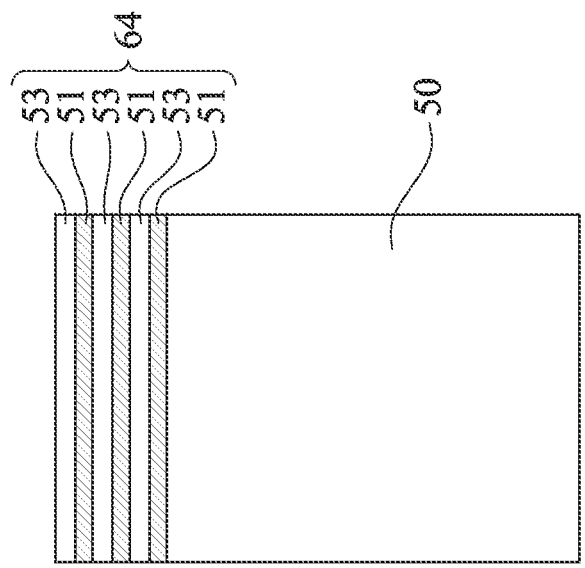
FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, and 15B illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments are described below in a particular context, a die comprising nano-FETs. Various embodiments may be applied, however, to dies comprising other types of transistors (e.g., fin field effect transistors (FinFETs), planar transistors, thin film transistors (TFTs), or the like) in lieu of or in combination with the nano-FETs.

FIGS. 1A to 15B illustrate a method for manufacturing a semiconductor device at various stages in accordance with some embodiments of the present disclosure.

Figure 1A:
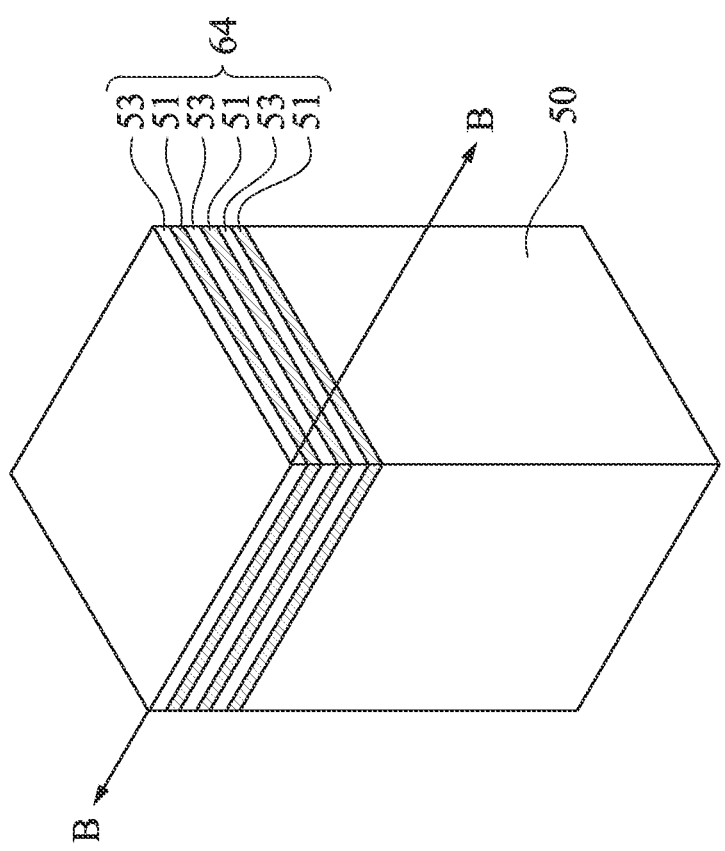

Reference is made to FIGS. 1A and 1B, in which FIG. 1B is a cross-sectional view along line B-B of FIG. 1A. Shown there is a substrate 50. The substrate 50 may be a semiconductor substrate, such as a bulk semiconductor, a semiconductor-on-insulator (SOI) substrate, or the like. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed over the substrate 50. The multi-layer stack 64 includes alternating layers of first semiconductor layers 51 and second semiconductor layers 53. For purposes of illustration, and as discussed in greater detail below, the first semiconductor layers 51 will be removed and the second semiconductor layers 53 will be patterned to form channel regions of nano-FETs.

The multi-layer stack 64 is illustrated as including three layers of each of the first semiconductor layers 51 and the second semiconductor layers 53 for illustrative purposes. In some embodiments, the multi-layer stack 64 may include suitable number of the first semiconductor layers 51 and the second semiconductor layers 53.

The first semiconductor layers 51 and the second semiconductor layers 53 may include different materials and/or components, such that the first semiconductor layers 51 and the second semiconductor layers 53 have different etching rates. In some embodiments, the first semiconductor layers 51 are made from SiGe. The germanium percentage (atomic percentage concentration) of the first semiconductor layers 51 is in the range between about 10 percent and about 20 percent, while higher or lower germanium percentages may be used. It is appreciated, however, that the values recited throughout the description are examples, and may be changed to different values. For example, the first semiconductor layers 51 may be $Si_{0.8}Ge_{0.2}$ or $Si_{0.9}Ge_{0.1}$, in which the proportion between Si and Ge may vary from embodiments, and the disclosure is not limited thereto. The second semiconductor layers 53 may be pure silicon layers that are free of germanium. The second semiconductor layers 53 may also be substantially pure silicon layers, for example, with a germanium percentage lower than about 1 percent. In some embodiments, the first semiconductor layers 51 have a higher germanium atomic percentage concentration than the second semiconductor layers 53. The first semiconductor layers 51 and the second semiconductor layers 53 may be formed by chemical vapor deposition (CVD), molecular beam epitaxy (MBE), or other suitable process(es). In some embodiments, the first semiconductor layers 51 and the second semiconductor layers 53 are formed by an epitaxy growth process, and thus the first semiconductor layers 51 and the second semiconductor layers 53 can also be referred to as epitaxial layers in this content.

Figure 2B:
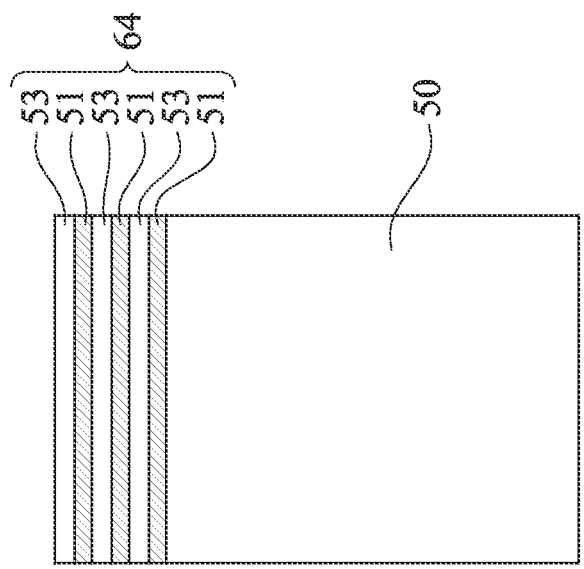
Figure 2A:
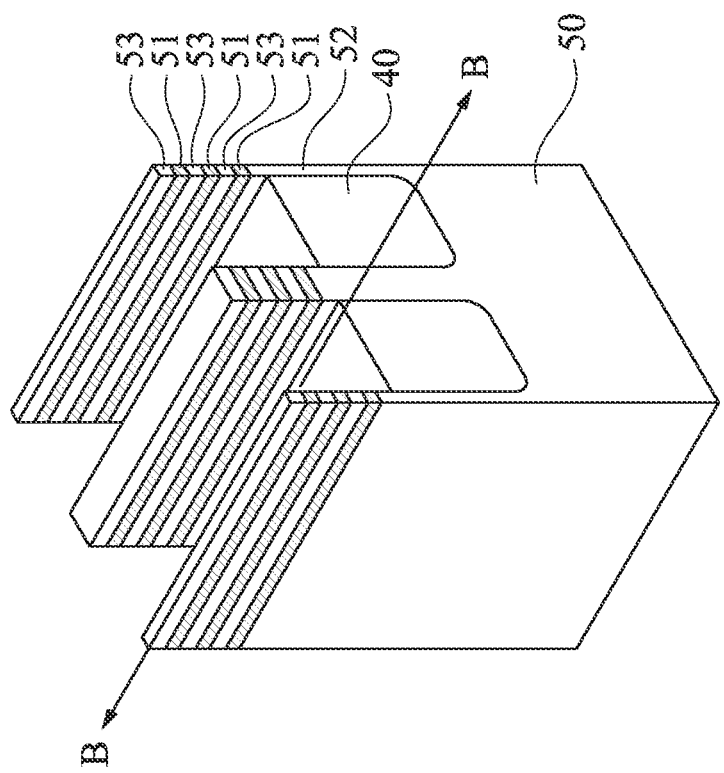

Reference is made to FIGS. 2A and 2B, in which FIG. 2B is a cross-sectional view along line B-B of FIG. 2A. The multi-layer stack 64 and the substrate 50 are patterned. Semiconductor strips 52 are formed protruding over the substrate 50. In some embodiments, the patterning may be formed by etching trenches in the multi-layer stack 64 and the substrate 50. The etching may be any acceptable etch process, such as a reactive ion etch (RIE), neutral beam etch (NBE), the like, or a combination thereof. The etching may be anisotropic. In some embodiments, the patterned semiconductor layers 51, 53, and the underlying semiconductor strip 52 can be collectively referred to as a fin structure.

The substrate 50 and the multi-layer stack 64 may be patterned by any suitable method. For example, the substrate 50 and the multi-layer stack 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the substrate 50 and the multi-layer stack 64.

Isolation structures 40 may be formed over the substrate 50 and laterally surrounding the semiconductor strips 52. The isolation structures 40 can be referred to as shallow trench isolation (STI) structures. The isolation structures 40 can be formed by, for example depositing a dielectric material blanket over the substrate 50 and overfilling the spaces between the semiconductor strips 52, performing a planarization process such as chemical mechanical polish (CMP) to remove excess dielectric material until the top surfaces of the semiconductor layers 53 are exposed. Afterward, the dielectric material is recessed, for example, through an etching operation, wherein diluted HF, SiCoNi (including HF and $NH_3$), or the like, may be used as the etchant.

In some embodiments, the isolation structures 40 are made of silicon oxide, silicon nitride, silicon oxynitride, fluoride-doped silicate glass (FSG), or other low-K dielectric materials. In some embodiments, the isolation structures 40 may be formed using a high-density-plasma (HDP) chemical vapor deposition (CVD) process, using silane ($SiH_4$) and oxygen ($O_2$) as reacting precursors. In some other embodiments, the isolation structures 40 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation structures 40 may be formed using a spin-on-dielectric (SOD) process, such as hydrogen silsesquioxane (HSQ) or methyl silsesquioxane (MSQ), Other processes and materials may be used. In some embodiments, the isolation structures 40 can have a multi-layer structure, for example, a thermal oxide liner layer with silicon nitride formed over the liner. Thereafter, a thermal annealing may be optionally performed to the isolation structures 40.

Figure 3B:
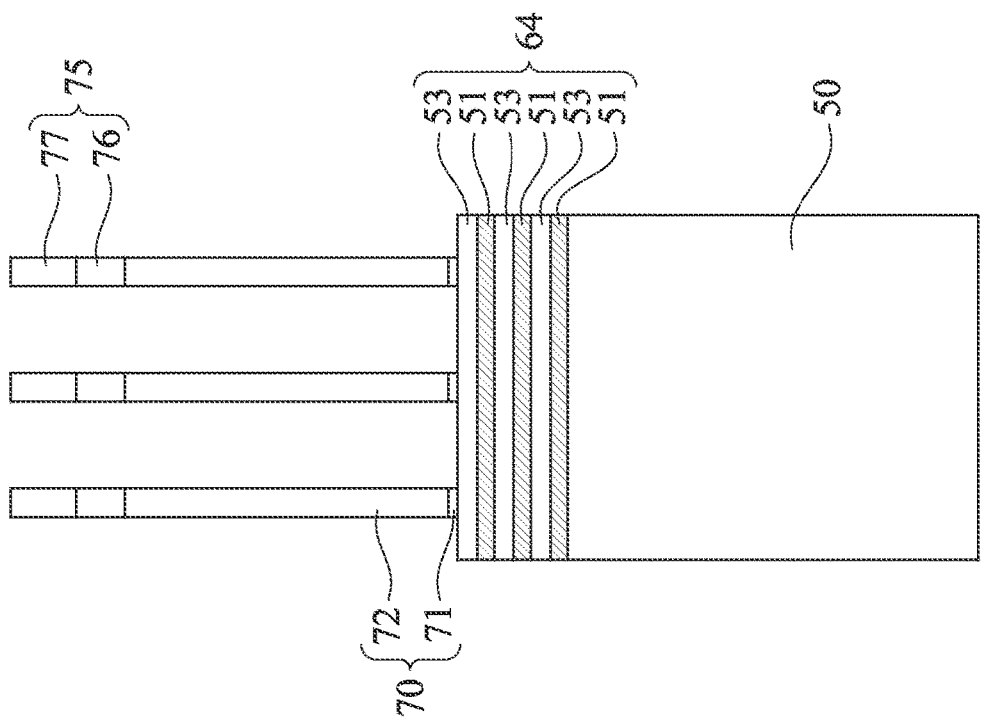
Figure 3A:
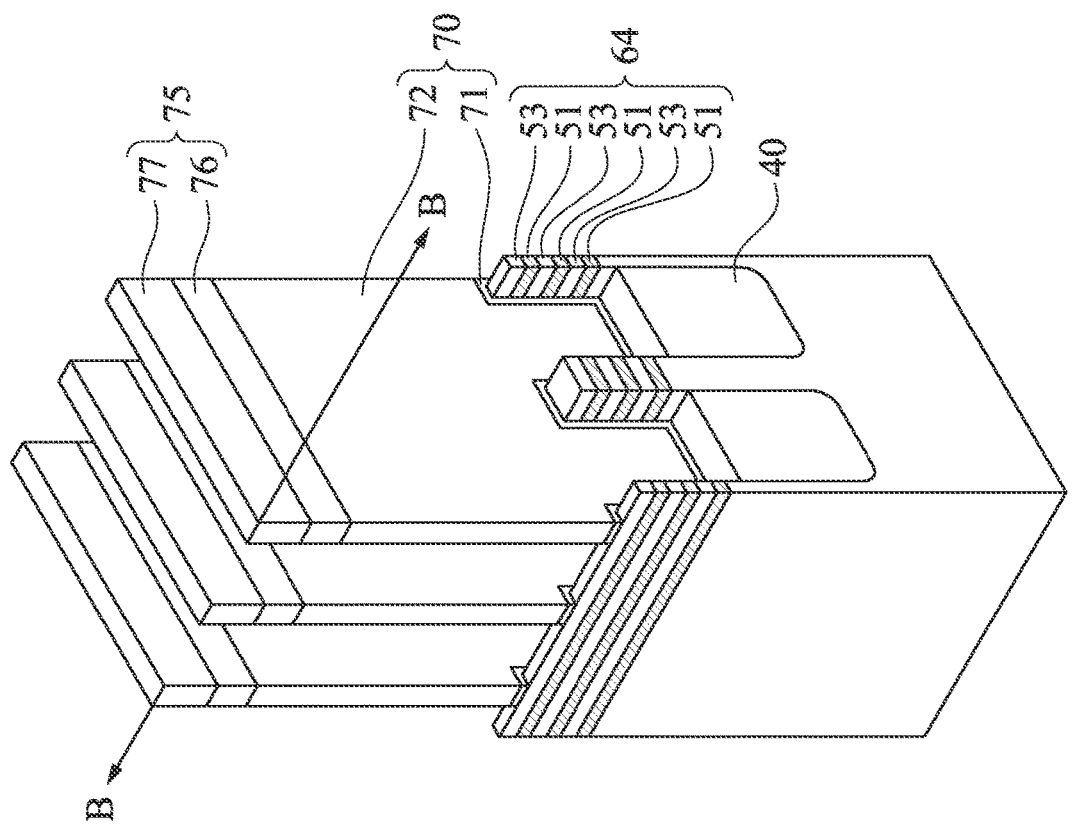

Reference is made to FIGS. 3A and 3B, in which FIG. 3B is a cross-sectional view along line B-B of FIG. 3A. Dummy gate structures 70 are formed over the substrate 50 and crossing the stack 64 of the first semiconductor layers 51 and the second semiconductor layers 53. In some embodiments, patterned masks 75 may be formed over the dummy gate structures 70.

In some embodiments, each of the dummy gate structures 70 includes a dummy gate dielectric 71 and a dummy gate electrode 72 over the dummy gate dielectric 71. The dummy gate dielectric 71 may be, for example, silicon oxide, silicon nitride, a combination thereof, or the like, and may be deposited or thermally grown according to acceptable techniques. The dummy gate electrode 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate electrode 72 and the dummy gate dielectric 71 may be formed by, for example, depositing a dummy dielectric layer and a dummy gate layer over the substrate, forming the patterned masks 75 over the dummy gate layer, and then performing a patterning process to the dummy dielectric layer and the dummy gate layer by using the patterned masks 75 as an etching mask. In some embodiments, the dummy gate electrode 72 may be deposited by physical vapor deposition (PVD), CVD, sputter deposition, or other techniques for depositing the selected material. In some embodiments, the dummy gate dielectric 71 may be formed by thermal oxidation.

In some embodiments, the each of the patterned masks 75 includes a first hard mask 76 and a second hard mask 77 over the first hard mask 76. The first hard iask 76 and the second hard mask 77 may be made of different materials. In some embodiments, the first hard mask 76 may be formed of silicon nitride, and the second hard mask 77 may be formed of silicon oxide.

Figure 4B:
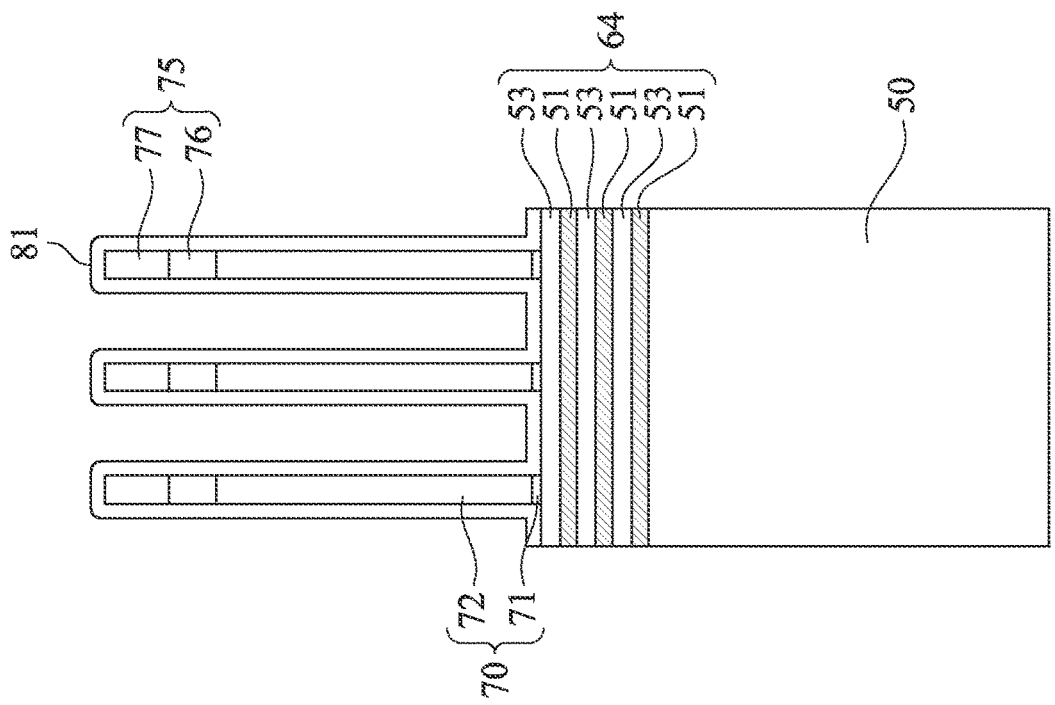
Figure 4A:
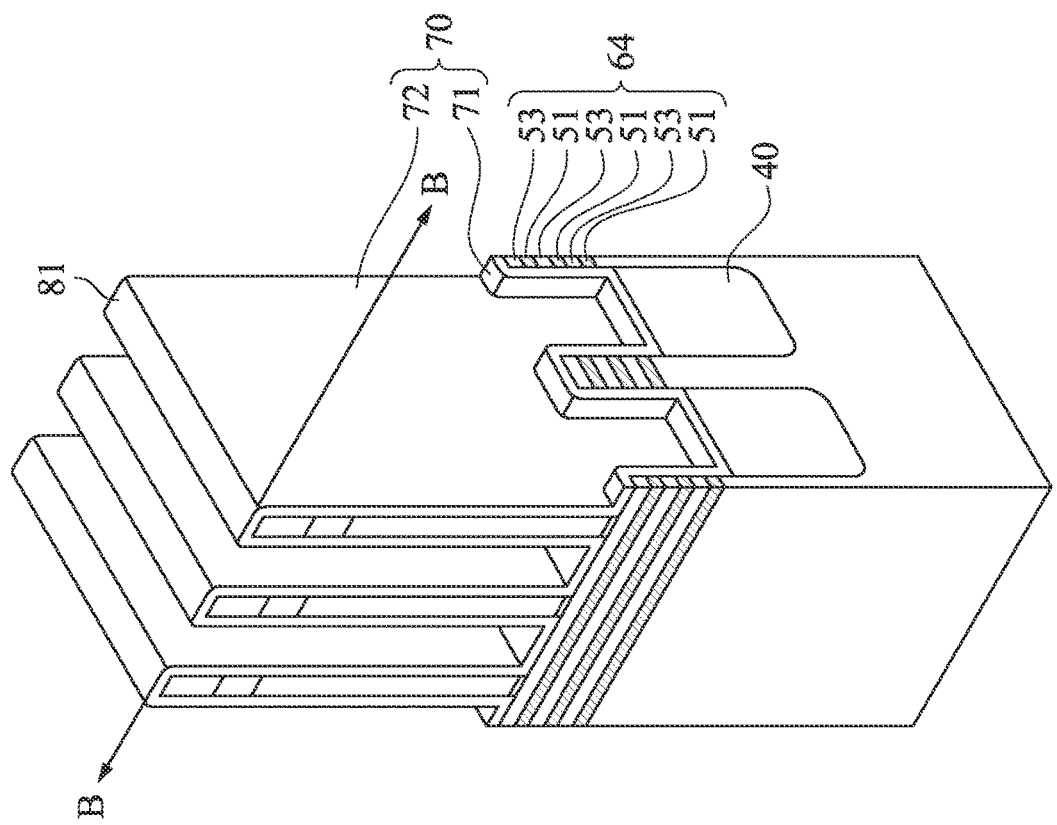

Reference is made to FIGS. 4A and 4B, in which FIG. 4B is a cross-sectional view along line B-B of FIG. 4A. Spacer layer 81 is formed blanketing over the substrate 50. In some embodiments, the spacer layer 81 may extend along surfaces of the patterned masks 75, the dummy gate structures 70, and the stack 64 of the first semiconductor layers 51 and second semiconductor layers 53. The spacer layer 81 may be formed of silicon oxide, silicon nitride, silicon oxynitride, combinations thereof, using techniques such as thermal oxidation or deposited by CVD, ALD, or the like.

Figure 5B:
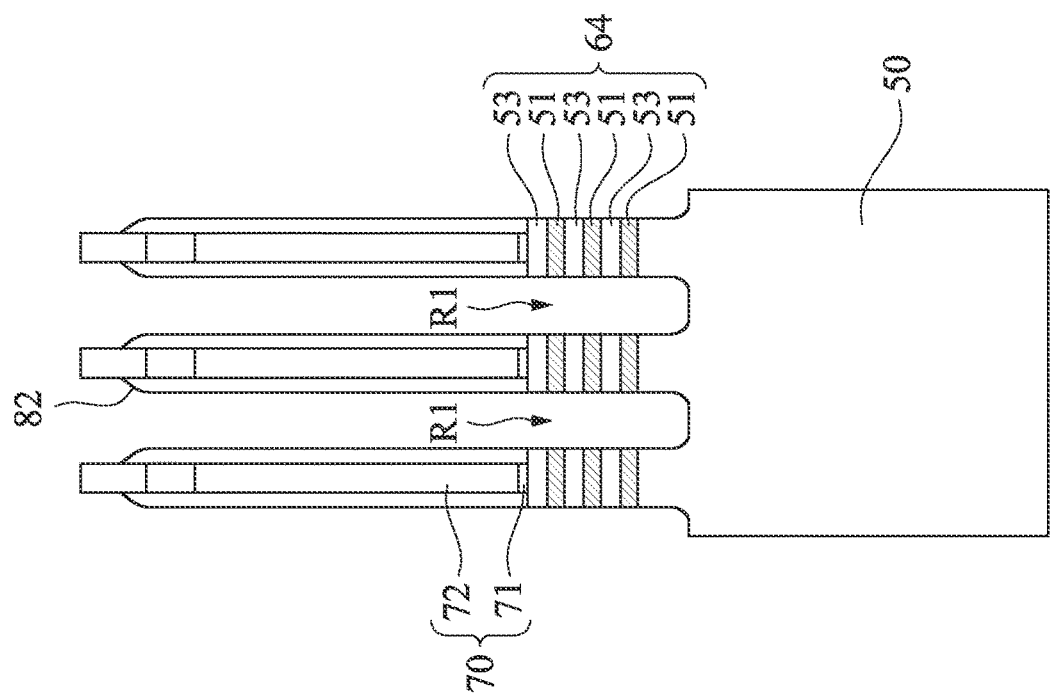
Figure 5A:
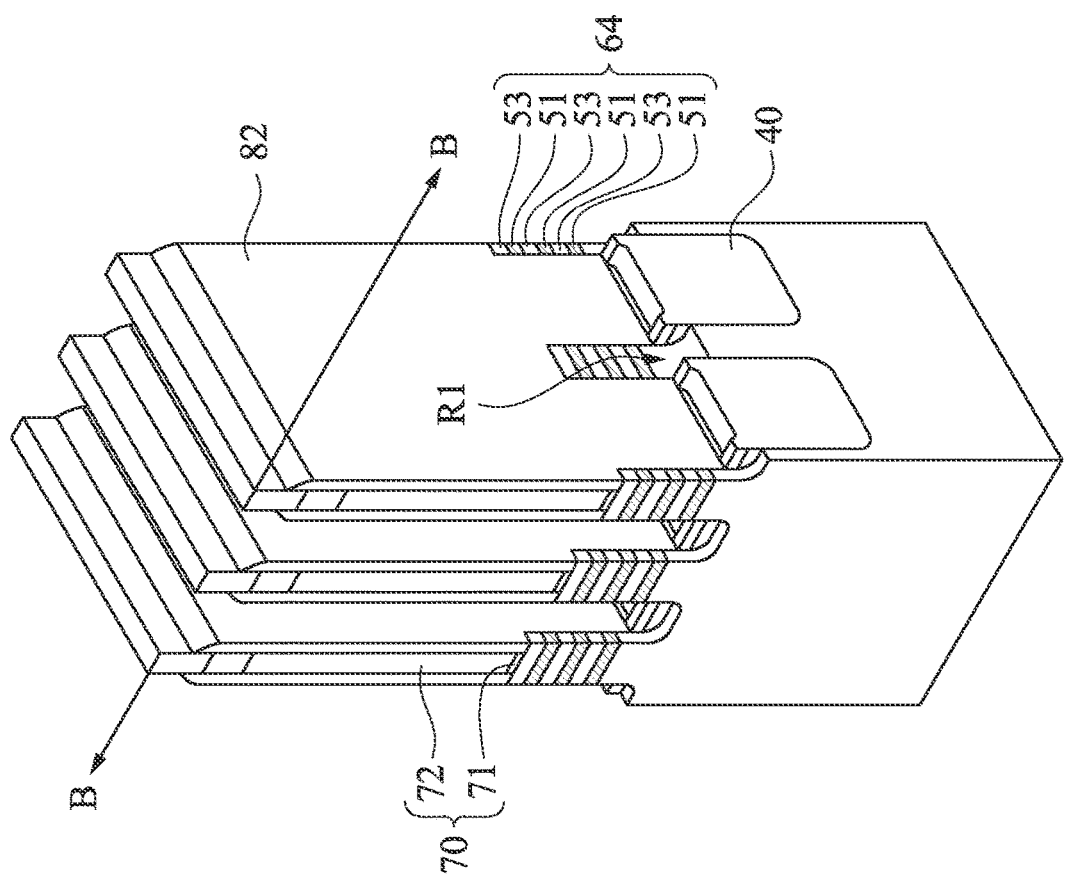

Reference is made to FIGS. 5A and 5B, in which FIG. 5B is a cross-sectional view along line B-B of FIG. 5A. An anisotropic etching process to remove horizontal portions of the spacer layer 81 (see FIGS. 4A and 4B), such that vertical portions of the spacer layer 81 remain on sidewalls of the dummy gate structures 70. The remaining portions of the spacer layer 81 can be referred to as gate spacers 82.

After the gate spacers 82 are formed, portions of the stack 64 of the first semiconductor layers 51 and second semiconductor layers 53 may be exposed. Then, another etching process may be performed to remove portions of the stack 64 of the first semiconductor layers 51 and second semiconductor layers 53 that are uncovered by the dummy gate structures 70 and the gate spacers 82, so as to form recesses R1. In some embodiments, the bottommost ends of the recesses R1 may be lower than top surfaces of the isolation structures 40 (see FIG. 5A), and may be lower than bottom surfaces of the dummy gate structures 70. Furthermore, the bottommost ends of the recesses R1 may be lower than top surfaces of the semiconductor strips 52 and bottom surfaces of the bottommost first semiconductor layers 51. In some embodiments, each of the recesses R1 may include a curved bottom surface.

In some embodiments, the etching process for forming the recesses R1 may also etch the isolation structures 40. As a result, as shown in FIG. 5A, along the lengthwise direction of the dummy gate structures 70, the top surface of each isolation structure 40 has a curved top surface. In greater details, along the lengthwise direction of the dummy gate structures 70, the top surface of each isolation structure 40 has a concave top surface.

Figure 6B:
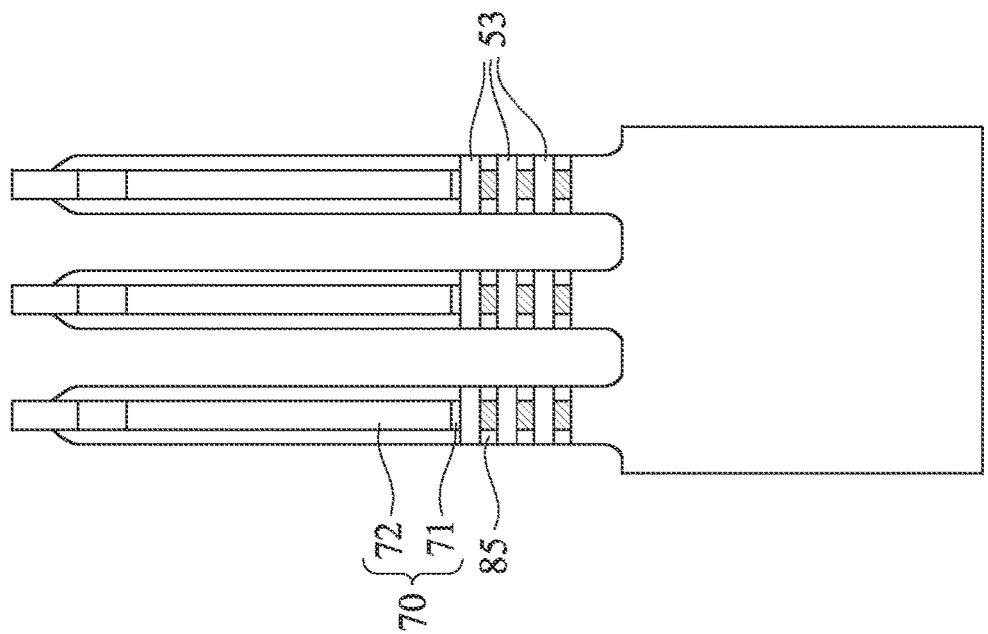
Figure 6A:
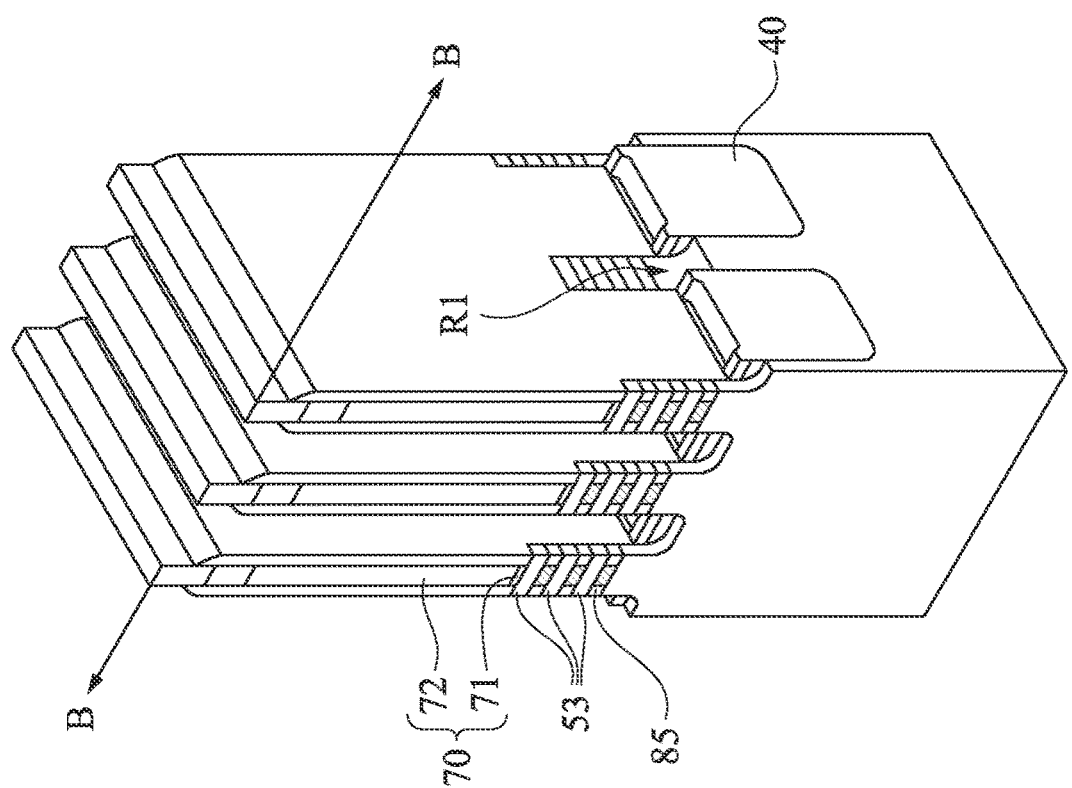

Reference is made to FIGS. 6A and 6B, in which FIG. 6B is a cross-sectional view along line B-B of FIG. 6A. Portions of the first semiconductor layers 51 exposed by the recesses R1 are laterally etched to form sidewall recesses, and then inner spacers 85 are formed in the sidewall recesses. In some embodiments, the sidewalls of the first semiconductor layers 51 may be etched using isotropic etching processes, such as wet etching or the like. In some embodiments in which the first semiconductor layers 51 include, e.g., SiGe, and the second semiconductor layers 53 include, e.g., Si, a dry etch process with tetramethylammonium hydroxide (TMAH), ammonium hydroxide (NH$_4$OH), or the like may be used to etch sidewalls of the first semiconductor layers 51.

The inner spacers 85 may be deposited by a conformal deposition process, such as CVD, ALD, or the like. The inner spacer layer may include a material such as silicon nitride or silicon oxynitride, although any suitable material, such as low-dielectric constant (low-k) materials having a k-value less than about 3.5, may be utilized. The inner spacers 85 may be formed by, for example, depositing an inner spacer layer blanket over the substrate 50 and filling the sidewall recesses of the first semiconductor layers 51, and then performing an anisotropic etching to remove unwanted portions of the inner spacer layer. Although outer sidewalls of the inner spacers 85 are illustrated as being flush with sidewalls of the second semiconductor layers 53, the outer sidewalls of the inner spacers 85 may extend beyond or be recessed from sidewalls of the second semiconductor layers 53. In some embodiments, the thickness of the inner spacers 85 is in a range from about 5 nm to about 12 nm.

Figure 7B:
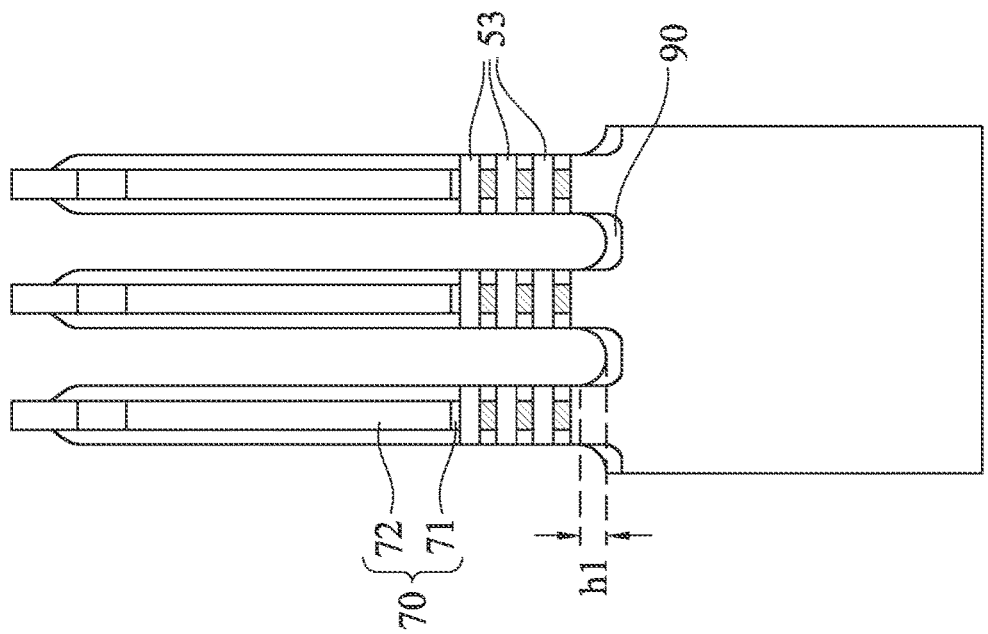
Figure 7A:
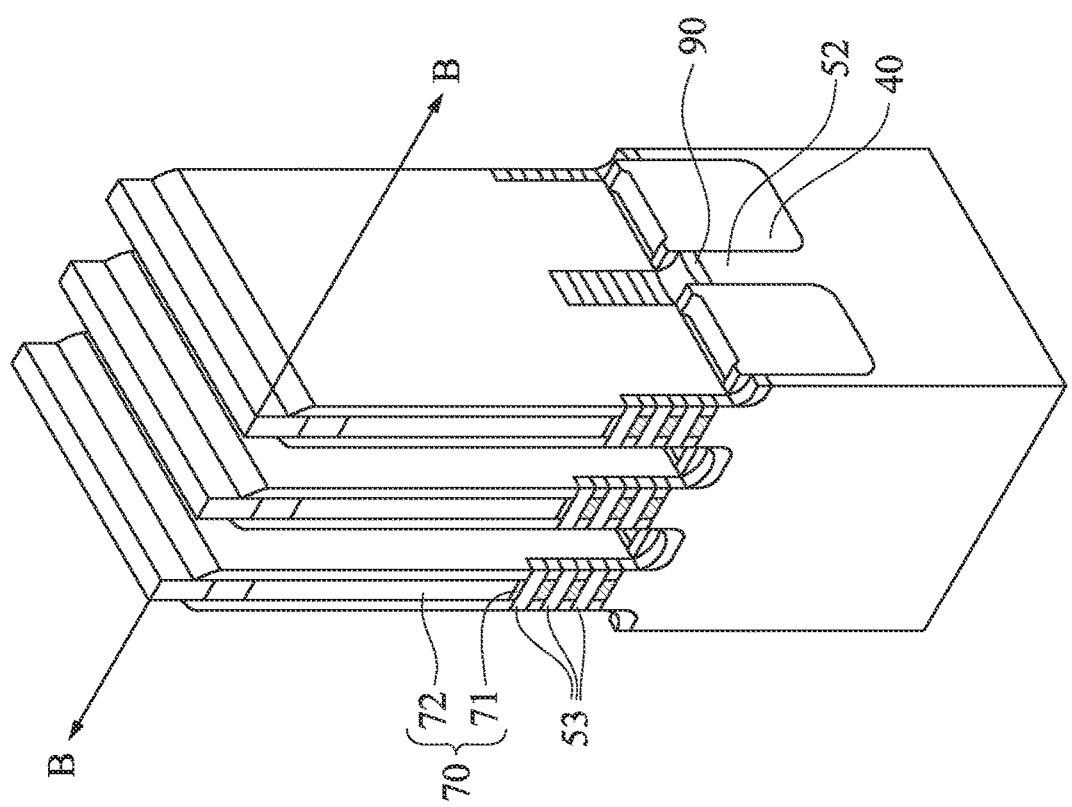

Reference is made to FIGS. 7A and 7B, in which FIG. 7B is a cross-sectional view along line B-B of FIG. 7A. Epitaxial layers 90 are formed in the recesses R1. In greater details, the epitaxial layers 90 may be formed by, for example, performing a deposition process, such as an epitaxial growth, to grow an epitaxial material in the recesses 91 until the epitaxial material filling the recesses R1. In some embodiments, the epitaxial layers 90 is made of a semiconductor material, and can also be referred to as semiconductor layers. In some embodiments, the epitaxial layers 90 may include a different composition or different material than the substrate 50. For example, the substrate 50 may be made of Si and the epitaxial layers 90 may be made of silicon germanium (SiGe). In some other embodiments, the epitaxial layers 90 may be made of SiGeB. In some embodiments, the germanium atomic concentration of the epitaxial layers 90 may be in a range from about 10% to about 50%. In some embodiments, the thickness of the epitaxial layers 90 is in a range from about 2 nm to about 10 nm.

In some embodiments, an etching back process may be performed to the epitaxial layers 90 until topmost ends of the epitaxial layers 90 are lower than top surfaces of the semiconductor strips 52, bottom surfaces of the bottommost first semiconductor layers 51. In some embodiments, as shown in FIG. 7A, the topmost ends of the epitaxial layers 90 may also be lower than topmost ends of the isolation structures 40.

As shown in FIG. 7B, after the etching process is completed, each of the epitaxial layers 90 has a curved top surface along the lengthwise direction of the semiconductor layers 51 (or the semiconductor strips 52). In greater details, each of the epitaxial layers 90 has a concave top surface along the lengthwise direction of the semiconductor layers 51 (or the semiconductor strips 52). In some embodiments, in the cross-sectional view of FIG. 7B, a height h1 between the topmost end of the top surface of the epitaxial layer 90 and the bottommost end of the surface of the epitaxial layer 90 is in a range from about 1 nm to about 5 nm.

However, as shown in FIG. 7A, after the etching process is completed, although each of the epitaxial layers 90 also has a curved top surface along the lengthwise direction of the dummy gate structures 70, each of the epitaxial layers 90 has a convex top surface along the lengthwise direction of the dummy gate structures 70.

Figure 8B:
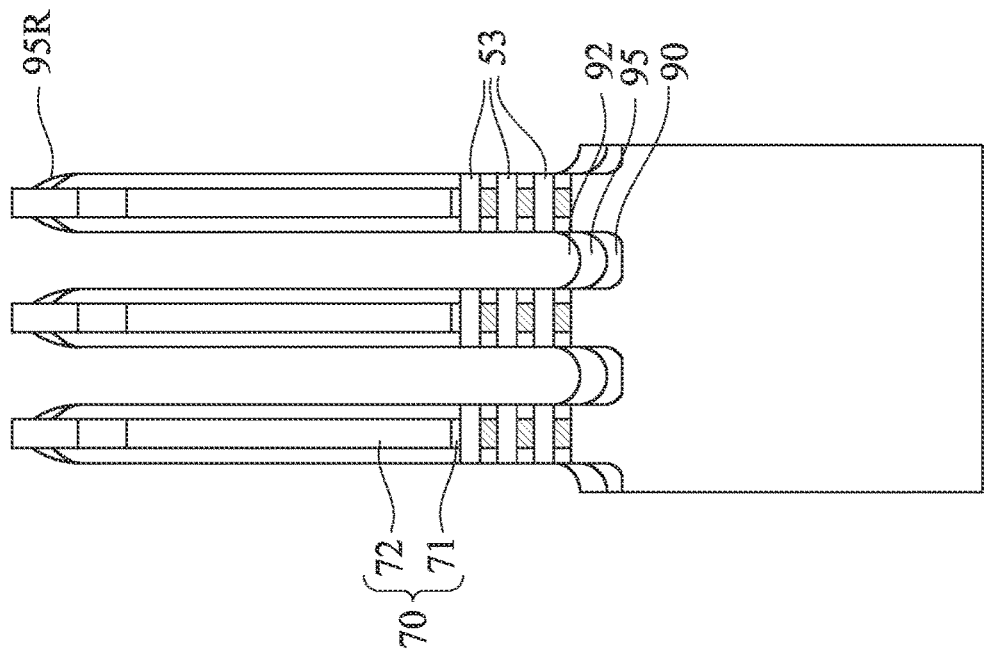
Figure 8A:
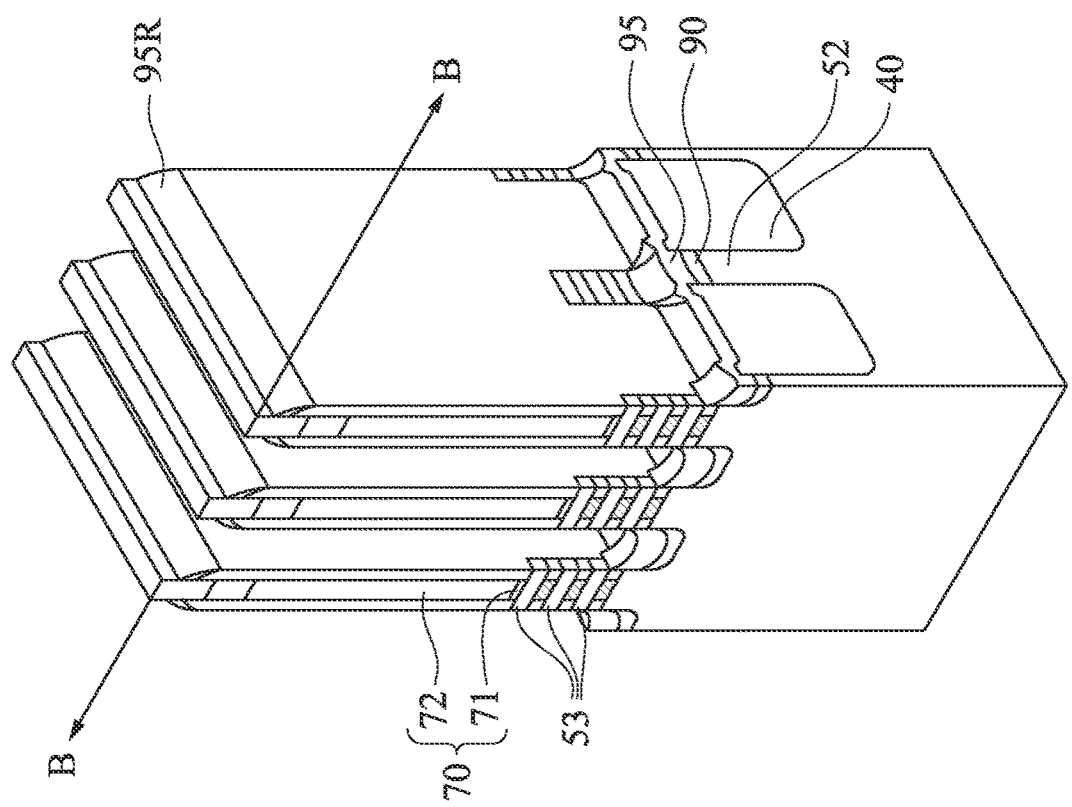

Reference is made to FIGS. 8A and 8B, in which FIG. 8B is a cross-sectional view along line B-B of FIG. 8A. Isolation layers 95 are formed over the epitaxial layers 90. In some embodiments, the isolation layers 95 are made of a dielectric material, such as SiN, SiCN, SiOCN, SiOC, the like, or combinations thereof. In some embodiments, the isolation layers 95 may be formed by, for example, depositing an isolation material over blanket over the substrate 50, and then performing an etching process to remove unwanted portions of the isolation material. The remaining isolation material may serve as the isolation layers 95. In some embodiments, isolation material also includes remaining portions 95R on top surfaces of the gate spacers 82 and on sidewalls of the patterned masks 75. In some embodiments, the thickness of the isolation layers 95 is in a range from about 2 nm to about 5 nm.

In some embodiments, the top surfaces of the isolation layers 95 are lower than the bottommost second semiconductor layers 53, and are lower than bottom surface of the gate structure 70. The bottom surfaces of the isolation layers 95 are lower than the top surfaces of the semiconductor strips 52 and bottom surfaces of the bottommost first semiconductor layers 51. In some embodiments, the isolation layers 95 may be in contact with the bottommost inner spacers 85.

In the cross-sectional view of FIG. 8B, each of the isolation layers 95 has a curved top surface. In greater details, each of the isolation layers 95 has a concave top surface. Moreover, each of the isolation layers 95 may form a curved interface with the underlying isolation layers 95.

In FIG. 8A, the isolation layers 95 may extend to top surfaces of the isolation structures 40. In some embodiments, each isolation layer 95 may form a curved interface with a corresponding isolation structure 40. In some embodiments, the isolation layers 95 may also be in contact with the gate spacers 82.

Figure 9B:
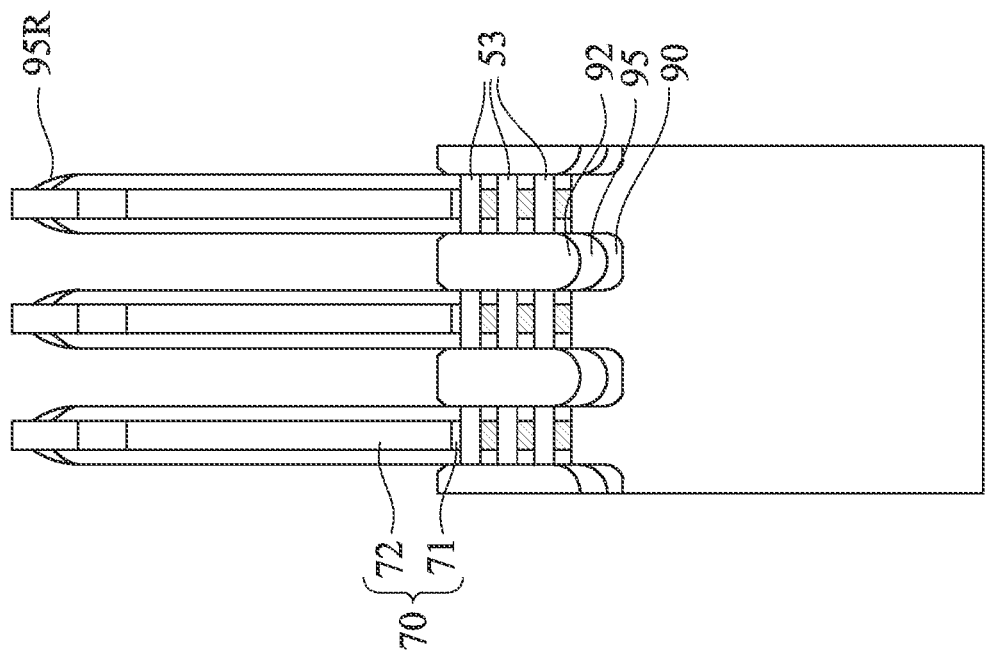
Figure 9A:
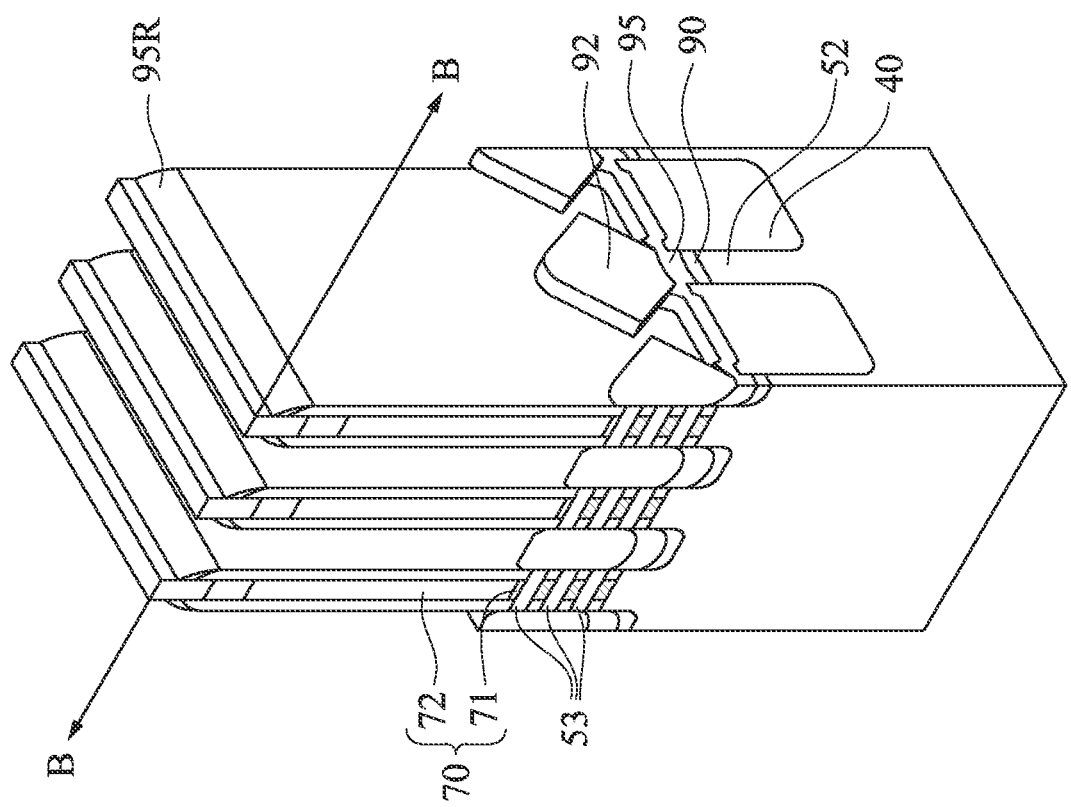

Reference is made to FIGS. 9A and 9B, in which FIG. 9B is a cross-sectional view along line B-B of FIG. 9A. Epitaxial source/drain structures 92 are formed in the recesses R1. As illustrated in FIG. 9B, the epitaxial source/drain structures 92 are formed in the recesses R1 such that each dummy gate structure 70 is disposed between respective neighboring pairs of the epitaxial source/drain structures 92. In some embodiments, the gate spacers 82 are used to separate the epitaxial source/drain structures 92 from the dummy gate structures 70, and the inner spacers 85 are used to separate the epitaxial source/drain structures 92 from the first semiconductor layers 51 by an appropriate lateral distance so that the epitaxial source/drain structures 92 do not short out with subsequently formed gates of the resulting nano-FETs. In some embodiments, the epitaxial source/drain structures 92 include n-type epitaxial material such as SiAs, SiP. The concentration of As and P may be in a range from about $5 \times 10^9/cm^3$ to about $5 \times 10^{21}/cm^3$. In other embodiments, the epitaxial source/drain structures 92 include p-type epitaxial material such as SiGe, SiGeB. The percentage of Ge is in a range from about 10% to about 50%. The concentration of B is in a range from about $5 \times 10^{19}/cm^3$ to about $5 \times 10^{21}/cm^3$. Source/drain region(s) may refer to a source or a drain, individually or collectively dependent upon the context.

Figure 10B:
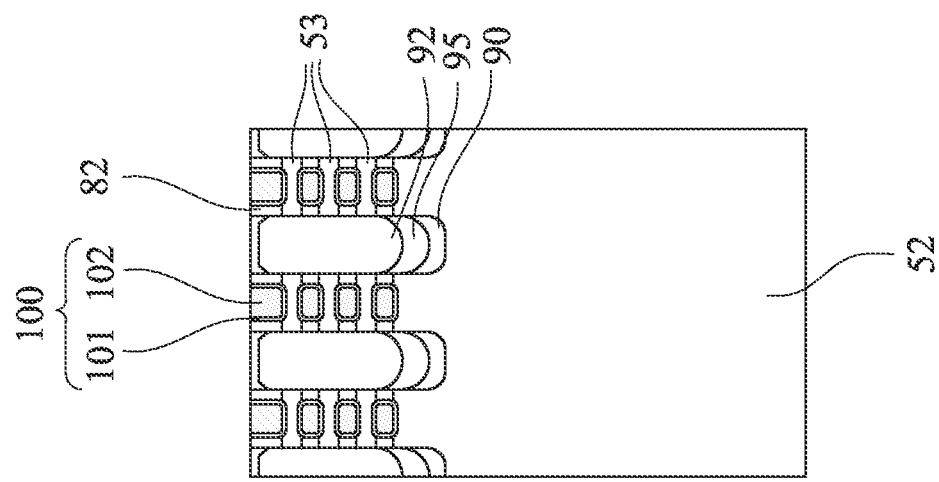
Figure 10A:
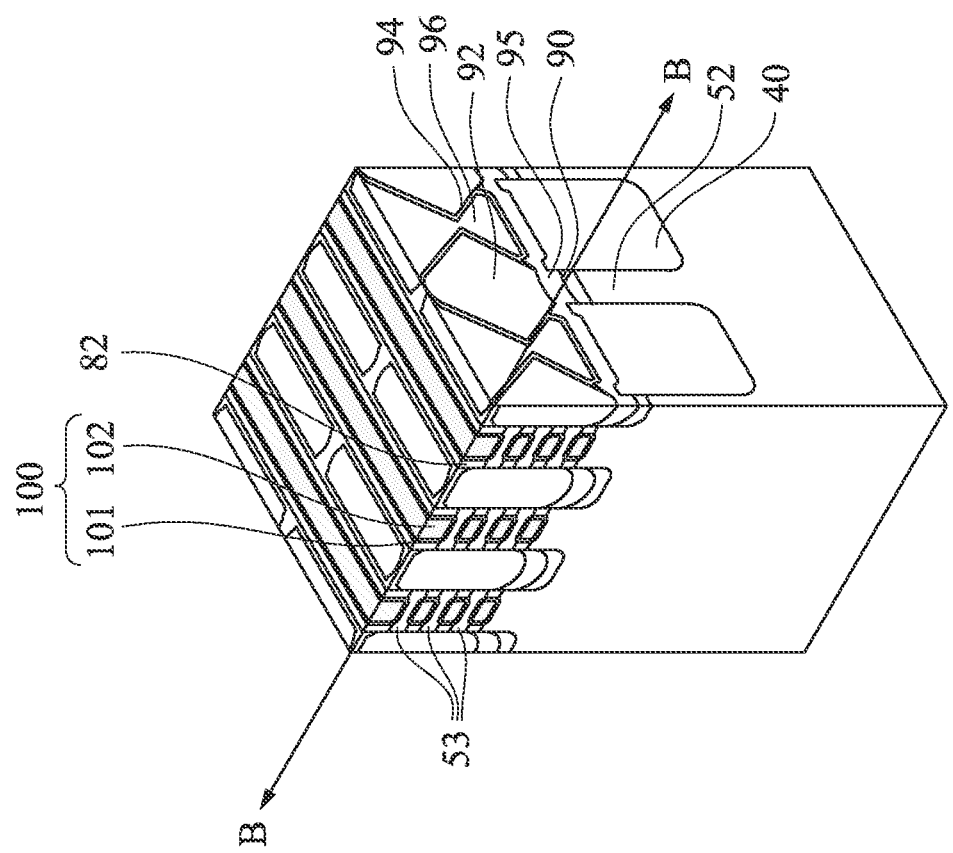

Reference is made to FIGS. 10A and 10B, in which FIG. 10B is a cross-sectional view along line B-B of FIG. 10A. An interlayer dielectric (ILD) layer 96 is deposited over the epitaxial source/drain structures 92 and laterally surrounding the dummy gate structures 70. In some embodiments, a CMP process may be performed to the ILD layer 96 until the top surfaces of the dummy gate structures 70 are exposed. The ILD layer 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 94 is disposed between the ILD layer 96 and the epitaxial source/drain structures 92. In some embodiments, the CESL 94 may also extend to the top surfaces of the isolation layers 95 as shown in FIG. 9A. The CESL 94 may include a dielectric material, such as, silicon nitride, silicon oxide, silicon oxynitride, or the like, having a different etch rate than the material of the overlying ILD layer 96.

After the ILD layer 96 and the CESL 94 are formed. The dummy gate structures 70 are removed to form gate trench between the gate spacers 82. In some embodiments, the dummy gate structures 70 may be removed by an anisotropic dry etch process. For example, the etching process may include a dry etch process using reaction gas(es) that selectively etch the dummy gate structures 70 at a faster rate than the ILD layer 96 or the gate spacers 82.

Next, the first semiconductor layers 51 are removed through the gate trench, such that portions of the second semiconductor layers 53 are suspended over the substrate 50. The first semiconductor layers 51 may be removed by performing an isotropic etching process such as wet etching or the like using etchants which are selective to the materials of the first semiconductor layers 51, while the second semiconductor layers 53 remain relatively unetched as compared to the first semiconductor layers 51. In embodiments where the first semiconductor layers 51 include, e.g., SiGe, and the second semiconductor layers 53 include, e.g., Si, tetramethylammonium hydroxide (TMAH), ammonium hydroxide ($NH_4OH$), or the like may be used to remove the first semiconductor layers 51.

After the removal of the first semiconductor layers 51, gate dielectric layers 101 and gate electrodes 102 are formed for replacement gates. The gate dielectric layers 101 are deposited conformally in the gate trenches. The gate dielectric layers 101 may be formed on top surfaces of the semiconductor strips 52 and on top surfaces, sidewalls, and bottom surfaces of the second semiconductor layers 53.

In accordance with some embodiments, the gate dielectric layers 101 may include one or more dielectric layers, such as an oxide, a metal oxide, the like, or combinations thereof. For example, in some embodiments, the gate dielectrics may include a silicon oxide layer and a metal oxide layer over the silicon oxide layer. In some embodiments, the gate dielectric layers 101 include a high-k dielectric material, and in these embodiments, the gate dielectric layers 101 may have a k value greater than about 7.0, and may include a metal oxide or a silicate of hafnium, aluminum, zirconium, lanthanum, manganese, barium, titanium, lead, and combinations thereof The formation methods of the gate dielectric layers 101 may include molecular-beam deposition (MBD), ALD, PECVD, and the like.

The gate electrodes 102 are deposited over the gate dielectric layers 101, respectively, and fill the remaining portions of the gate trench. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated, the gate electrodes 102 may include any number of liner layers, any number of work function tuning layers, and a fill material.

After the filling of the gate trenches, a planarization process, such as a CMP, may be performed to remove the excess portions of the gate dielectric layers 101 and the material of the gate electrodes 102, which excess portions are over the top surface of the ILD layer 96. The remaining portions of material of the gate electrodes 102 and the gate dielectric layers 101 thus form replacement gate structures of the resulting nano-FETs. The gate electrodes 102 and the gate dielectric layers 101 may be collectively referred to as metal gate structures 100.

In some embodiments, after the metal gate structures 100 are formed, each semiconductor layer 53 may include different thicknesses along the lengthwise direction of the semiconductor strip 52 (see FIG. 10B). For example, a thickness of the semiconductor layer 53 at the center of the semiconductor layer 53 is in a range from about 4 nm to about 10 nm, while a thickness of the semiconductor layer 53 at the edges of the semiconductor layer 53 is in a range from about 5 nm to about 12 nm.

Figure 11B:
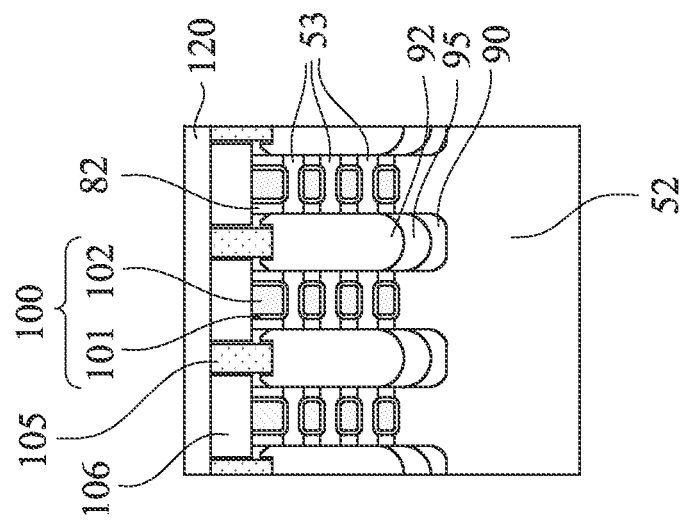
Figure 11A:
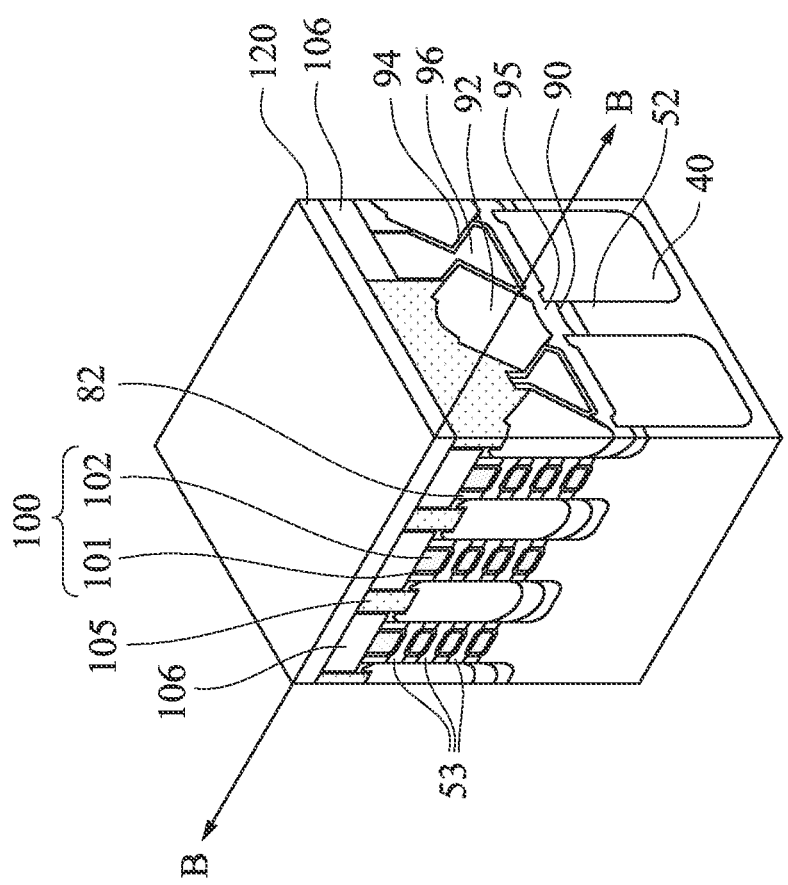

Reference is made to FIGS. 11A and 11B, in which FIG. 11B is a cross-sectional view along line B-B of FIG. 11A. An interlayer dielectric (ILD) layer 106 is formed over the ILD layer 96 and covering the metal gate structures 100. The ILD layer 106 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

Source/drain contacts 105 are formed in the ILD layers 106 and 96, respectively. In some embodiments, the source/drain contacts 105 may be formed by, for example, etching the ILD layers 106 and 96 to form contact openings, depositing one or more conductive materials in the contact openings, and performing a CMP process to remove excess conductive materials until the top surface of the ILD layer 106 is exposed. The source/drain contacts 105 may include one or more layers, such as barrier layers, diffusion layers, and fill materials. In some embodiments, the contacts each may include a barrier layer made of titanium, titanium nitride, tantalum, tantalum nitride, or the like, and a conductive material made of copper, a copper alloy, silver, gold, tungsten, cobalt, aluminum, nickel, or the like.

An interconnect structure 120 is formed over the ILD layer 106. The interconnect structure 120 may also be referred to as a front-side interconnect structure because it is formed on a front-side of the semiconductor strip 52 of the substrate 50. The interconnect structure 120 may include one or more layers of conductive features formed in one or more stacked dielectric layers. Each of the stacked dielectric layers may include a dielectric material, such as a low-k dielectric material, an extra low-k (ELK) dielectric material, or the like.

Conductive features may include conductive lines and conductive vias interconnecting the layers of conductive lines. The conductive vias may extend through respective ones of the dielectric layers in the interconnect structure 120 to provide vertical connections between layers of conductive lines. The conductive features may be formed through any acceptable process, such as, a damascene process, a dual damascene process, or the like.

Figure 12B:
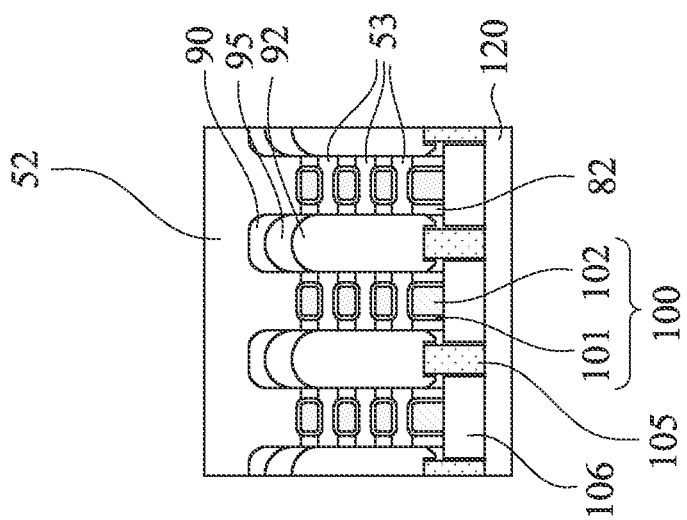
Figure 12A:
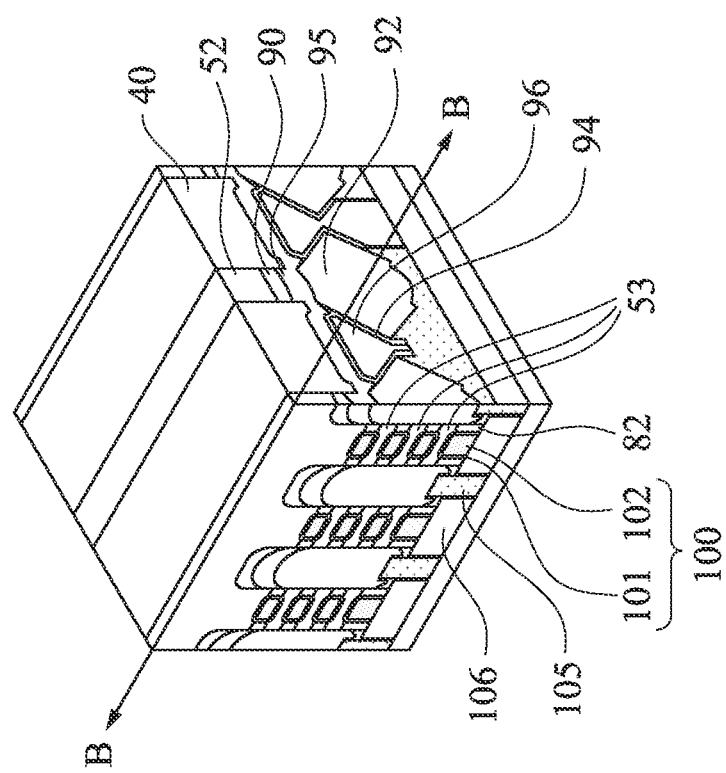

Reference is made to FIGS. 12A and 12B, in which FIG. 12B is a cross-sectional view along line B-B of FIG. 12A. The structure of FIGS. 11A and 11B is flipped over by 180 degrees, such that a backside of the substrate 50 faces upwards. The backside of the substrate 50 may refer to a side opposite to the front-side of the substrate 50 on which the device layer (e.g., layer including a transistor) is formed. Next, a grinding process is performed on the backside of the substrate 50. In some embodiments, the grinding process is controlled to remove portions of the substrate 50 until the isolation structures 40 are exposed. In some embodiments, surfaces of the semiconductor strips 52 may be level with the exposed surfaces of the isolation structures 40.

Figure 13B:
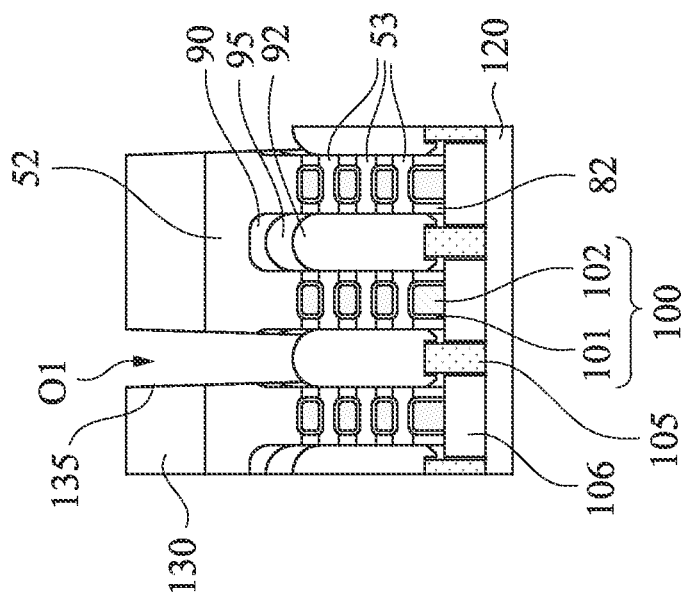
Figure 13A:
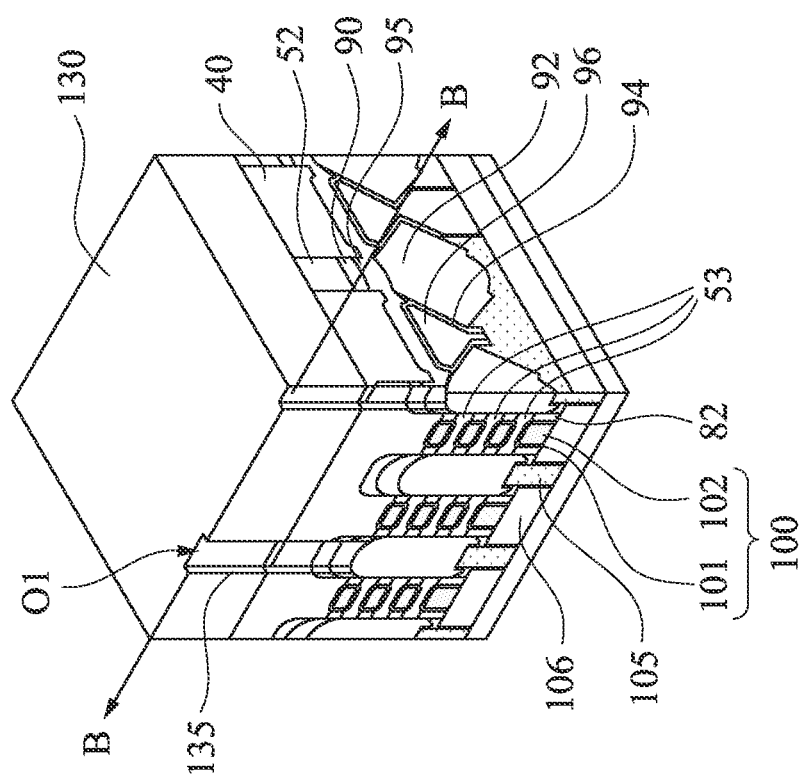

Reference is made to FIGS. 13A and 13B, in which FIG. 13B is a cross-sectional view along line B-B of FIG. 13A. A dielectric layer 130 is formed over the isolation structures 40 and the semiconductor strips 52. In some embodiments, the dielectric layer 130 may include SiO, HfSi, SiOC, AlO, ZrSi, AON, ZrO, HfO, TiO, ZrAlO, ZnO, TaO, LaO, YO, TaCN, SiN, SiOCN, Si, SiOCN, ZrN, SiCN, or the like. The dielectric layer 130 may be formed by suitable deposition process, such as CVD, ALD, PVD, or the like. In some embodiments, the thickness of the dielectric layer 130 is in a range from about 5 nm to about 40 nm. In some embodiments, the dielectric layer 130 may also be referred to as a hard mask.

Then, an etching process is performed to remove portions of the dielectric layer 130, the semiconductor strips 52, the epitaxial layers 90, and the isolation layers 95 to form via openings O1 that expose the epitaxial source/drain structures 92. In some embodiments, the bottom ends of the via openings O1 may be higher than topmost ends of the metal gate structures 100. In the cross-sectional view of FIG. 13B, the via opening O1 may extend through the dielectric layer 130, the semiconductor strips 52, the epitaxial layers 90, and the isolation layers 95.

Figure 14B:
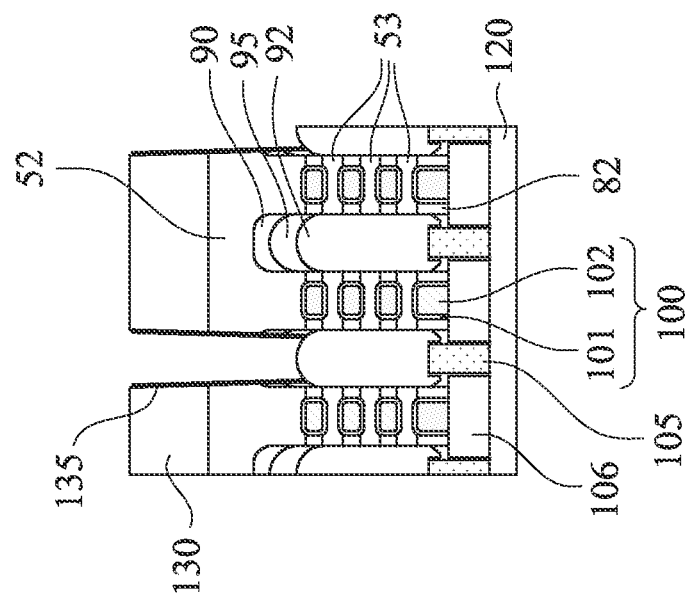
Figure 14A:
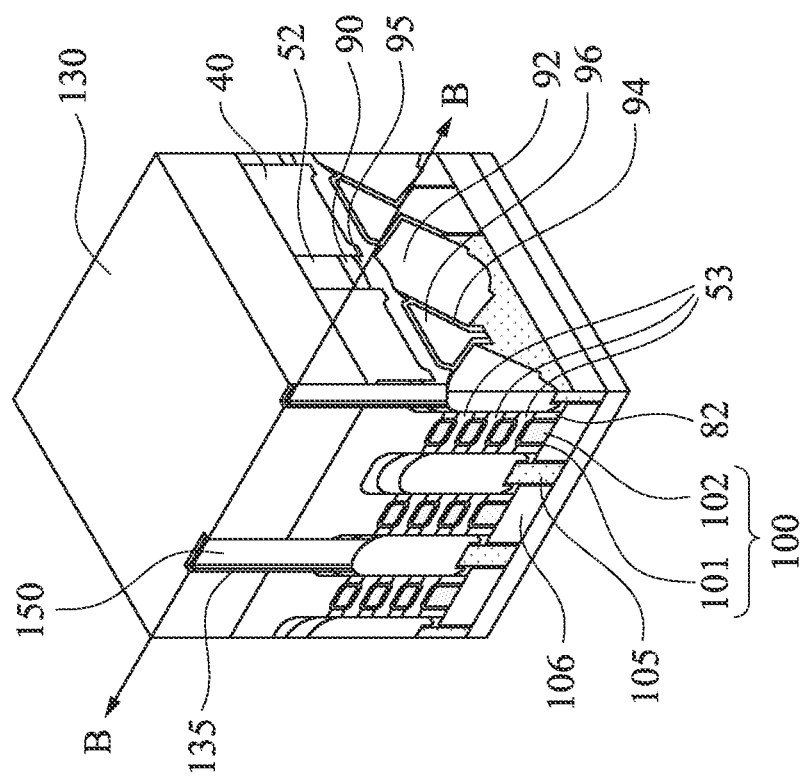

Reference is made to FIGS. 14A and 14B, in which FIG. 14B is a cross-sectional view along line B-B of FIG. 14A. A liner 135 is formed in the via openings O1 and lining sidewalls of the via openings O1. In some embodiments, the liner 135 may be formed by, for example, depositing a dielectric layer blanket over the dielectric layer 130 and filling the via openings O1, and then performing an anisotropic etching to remove horizontal portions of the dielectric layer from surfaces of the isolation structures 40 and surfaces of the epitaxial source/drain structures 92, such that vertical portions of the dielectric layer remain on sidewalls of the via openings O1.

In the cross-sectional view of FIG. 14B, the liner 135 is in contact with the sidewalls of the dielectric layer 130, the semiconductor strips 52, the epitaxial layers 90, and the isolation layers 95. The liner 135 may also be in contact with the epitaxial source/drain structures 92, while portions of the epitaxial source/drain structures 92 are still uncovered by the liner 135 and are exposed through the via openings O1 after the liner 135 is formed.

Figure 15B:
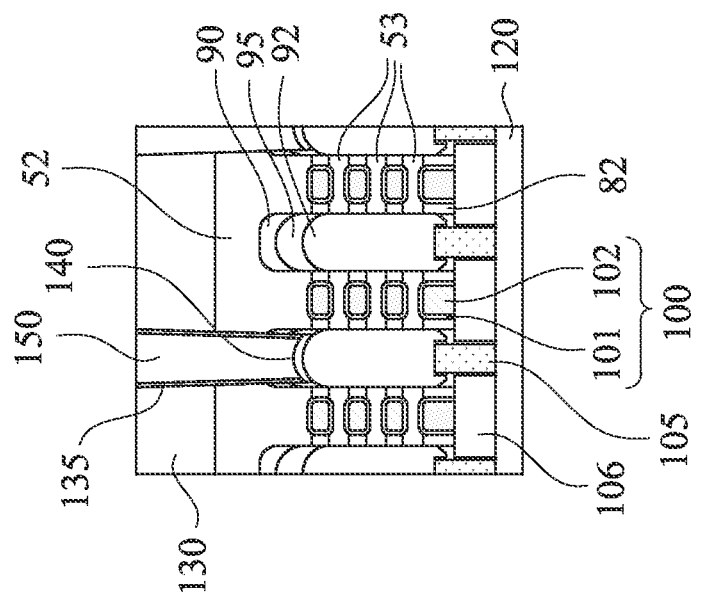
Figure 15A:
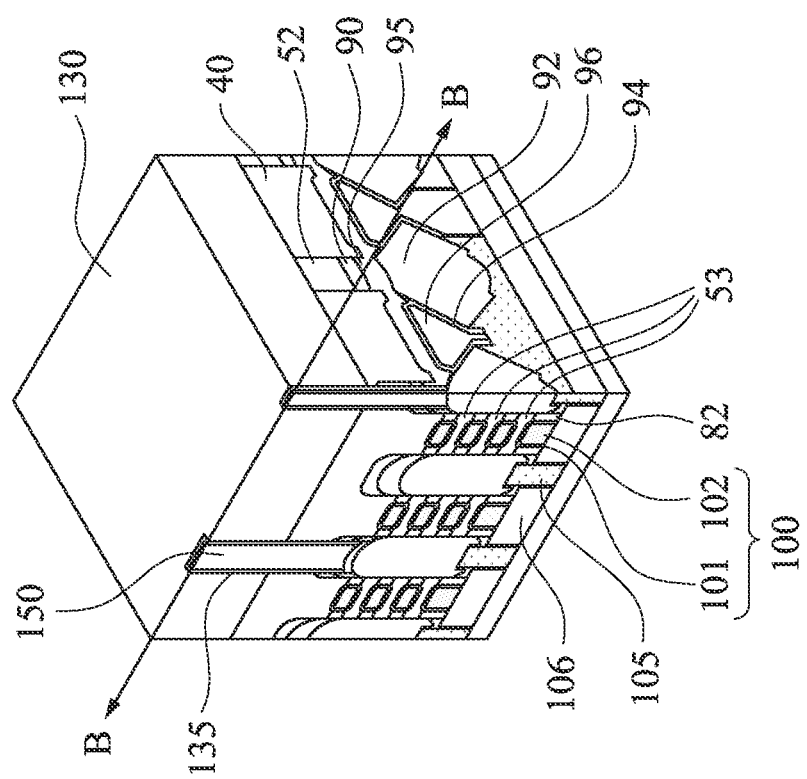

Reference is made to FIGS. 15A and 15B, in which FIG. 15B is a cross-sectional view along line B-B of FIG. 15A. Silicide layers 140 are formed on exposed surfaces of the epitaxial source/drain structures 92. In some embodiments, the silicide layers 140 may incldue TiSi, CrSi, TaSi, MoSi, ZrSi, HfSi, ScSi, Ysi, HoSi, TbSI, GdSi, LuSi, DySi, ErSi, YbSi. In some embodiments, the silicide layers 140 are formed by first depositing a metal (not shown) capable of reacting with the semiconductor materials of the underlying epitaxial source/drain structures 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain structures 92, then performing a thermal anneal process to form the silicide layers. The un-reacted portions of the deposited metal are then removed, e.g., by an etching process. In some embodiments, the thickness of the silicide layers 140 is in a range from about 1 nm to about 10 nm.

In the cross-sectional view of FIG. 15B, the liner 135 may be in contact with opposite sidewalls of the silicide layers 140. In some embodiments, the silicide layers 140 may be separated from the epitaxial layers 90, and may be in contact with the isolation layers 95.

After the silicide layers 140 are formed, backside vias 150 are formed in the via openings O1. In some embodiments, the backside vias 150 may be formed by, for example, depositing conductive materials on the via openings O1, and then performing a CMP process to remove excess conductive materials until the dielectric layer 130 is exposed. In some embodiments, the backside vias 150 may include W, Ru, Co, Cu, Ti, TiN, Ta, TaN, Mo, Ni, or the like. In some embodiments, the height of the backside vias 150 is in a range from about 5 nm to about 50 nm. The top width (widest width) of backside vias 150 is in a range from about 5 nm to about 50 nm. The bottom width (narrowest width) of backside vias 150 is in a range from about 4 nm to about 40 nm.

Figure 16:
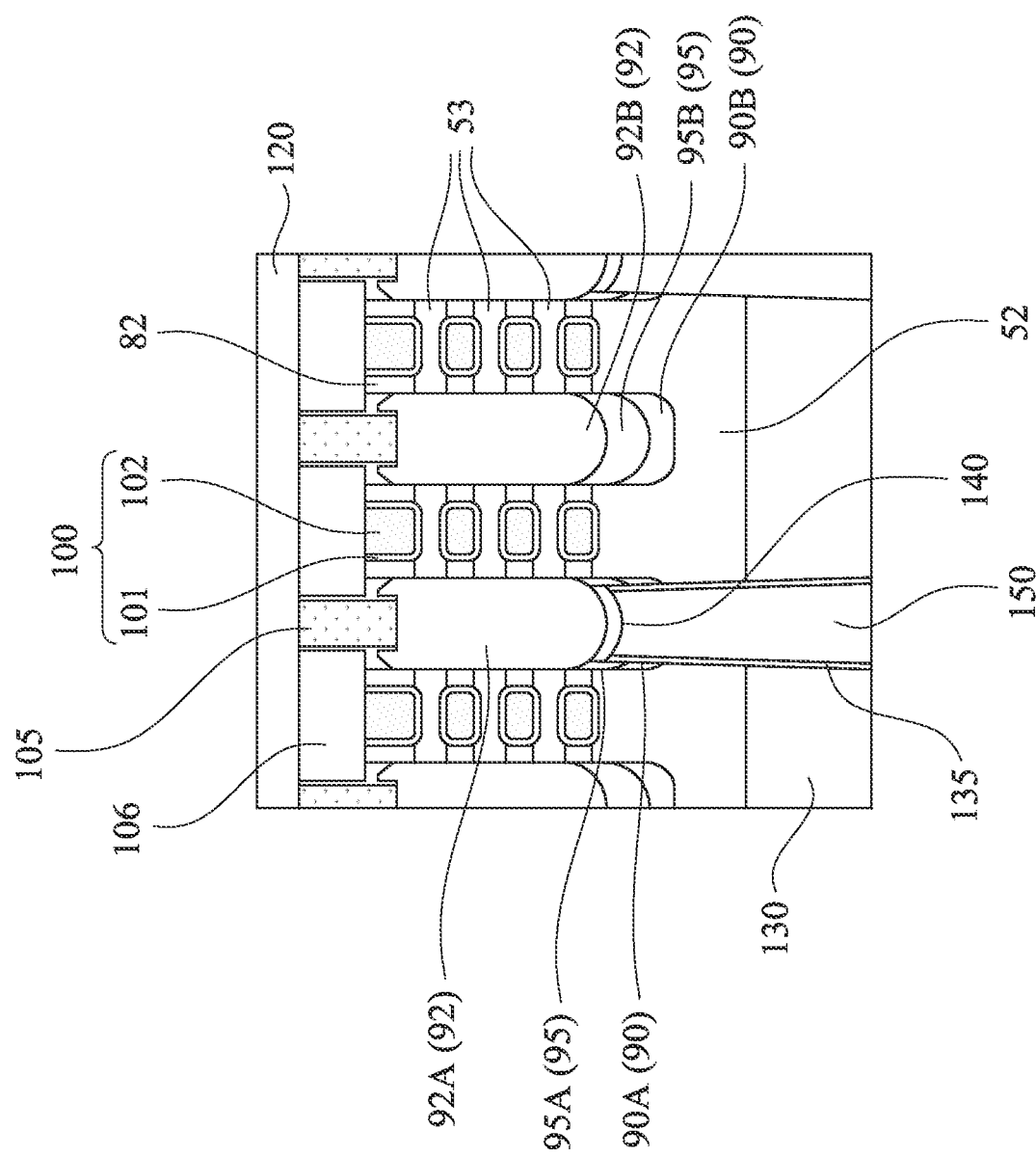
FIG. 16 illustrates a cross-sectional view of a semiconductor device in accordance with some embodiments of the present disclosure.

FIG. 16 illustrates a cross-sectional view of a semiconductor device in accordance with some embodiments of the present disclosure. It is noted that some elements of FIG. 16 are the same as those described with respect to FIGS. 1A to 15B, such elements are labeled the same and relevant details will not be repeated for brevity.

The semiconductor device includes a semiconductor strip 52, and a plurality of semiconductor layers 53 vertically stacked over a front side of the semiconductor strips 52. In some embodiments, the semiconductor layers 53 can also be referred to as nanostructures, nanosheets, or nanowires. The semiconductor device includes a gate structure 100 wraps around each of the semiconductor layers 53. The semiconductor device also includes an epitaxial source/drain structure 92A on one side of the gate structure 100 and in contact with the semiconductor layers 53, and an epitaxial source/drain structure 92B on another side of the gate structure 100 and in contact with the semiconductor layers 53. The semiconductor layers 53, the gate structure 100, and the epitaxial source/drain structures 92A/92B may collectively form a transistor.

The semiconductor device also include source/drain contacts 105 disposed on top surfaces of the epitaxial source/drain structures 92A and 92B, respectively.

With respect to the epitaxial source/drain structure 92A, an epitaxial layer 90A is within the semiconductor strip 52 and below the epitaxial source/drain structure 92A. Moreover, an isolation layer 95A is disposed over the epitaxial layer 90A, and may vertically separate the epitaxial layer 90A from the epitaxial source/drain structure 92A. A dielectric layer 130 is disposed on a backside of the semiconductor strip 52. A backside via 150 is disposed in the dielectric layer 130, the epitaxial layer 90A, and the isolation layer 95A, and is electrically connected to the epitaxial source/drain structure 92A through a silicide layer 140. A liner 135 is disposed on opposite sidewalls of the backside via 150. In some embodiments, the backside via 150 is electrically connected to a power line, thus the epitaxial source/drain structure 92A may act as a source region of the transistor, and can be referred to as source structure.

In the cross-sectional view of FIG. 16, the silicide layer 140 is in contact with the bottom surface of the epitaxial source/drain structure 92A, the isolation layer 95A is in contact with the opposite sidewalls of the silicide layer 140, the liner 135 and the backside via 150 are in contact with a bottom surface of the silicide layer 140. In some embodiments, the liner 135 may laterally separate the backside via 150 from the epitaxial layer 90A, the isolation layer 95A, and the dielectric layer 130.

In some embodiments, the topmost end of the epitaxial layer 90A may be lower than the bottom surface of the bottommost semiconductor layer 53, the top surface of the semiconductor strip 52, and the bottom surface of the gate structure 100. Moreover, the topmost end of the isolation layer 95A may be higher than the bottom surface of gate structure 100 and the top surface of the semiconductor strip 52. Furthermore, the topmost end of the backside via 150 may be higher than the topmost end of the epitaxial layer 90A.

With respect to the epitaxial source/drain structure 92B, an epitaxial layer 90B is within the semiconductor strip 52 and below the epitaxial source/drain structure 92B. Moreover, an isolation layer 95B is disposed over the epitaxial layer 90B, and may vertically separate the epitaxial layer 90B from the epitaxial source/drain structure 92B.

The epitaxial source/drain structure 92B is different from the epitaxial source/drain structure 92A, in that there is no backside via in contact with the bottom surface of the epitaxial source/drain structure 92B. That is, in the cross-sectional view of FIG. 16, the isolation layer 95B may substantially cover an entirety of the bottom surface of the epitaxial source/drain structure 92B. For example, after the via openings O1 in FIGS. 13A and 13B are formed, the epitaxial source/drain structure 92B may still be covered by the semiconductor strip 52 and the dielectric layer 130. In some embodiments, the epitaxial source/drain structure 92B may be act as a drain region of the transistor, and can be referred to as drain structure.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that, by forming a buried epitaxial layer and an isolation layer below the epitaxial source/drain structure, the buried epitaxial layer and the isolation layer may collectively serve as an etch back structure for forming a backside via. Due to etch back structure, the loss window of the epitaxial source/drain structure can be enlarged. Accordingly, the isolation distance between the backside via and the closest semiconductor channel layer may be enlarged, which in turn will reduce the risk of damaging the closest semiconductor channel layer.

In some embodiments of the present disclosure, a method includes forming a semiconductor strip and semiconductor layers vertically stacked over a front side of the semiconductor strip; forming a gate structure over the semiconductor layers; etching the semiconductor strip to form recesses in the semiconductor strip and on opposite sides of the gate structure; forming epitaxial layers in the recesses, respectively; forming isolation layers over the epitaxial layers, respectively; forming epitaxial source/drain structures over the isolation layers, respectively; performing an etching process from a backside of the semiconductor strip to form a via opening extending through the semiconductor strip, one of the epitaxial layer, and one of the isolation layer, wherein one of the epitaxial source/drain structures is exposed through the via opening; and forming a backside via in the via opening.

In some embodiments, the method further includes etching back the epitaxial layers such that top surfaces of the epitaxial layers are lower than a top surface of the semiconductor strip.

In some embodiments, the method further includes forming a dielectric layer on the backside of the semiconductor strip, wherein the etching process is performed to the dielectric layer and the via opening is formed in the dielectric layer.

In some embodiments, the method further includes forming a silicide layer on an exposed portion of the one of the epitaxial source/drain structures prior to forming the backside via.

In some embodiments, the method further includes forming a liner lining sidewalls of the via opening prior to forming the backside via, wherein a portion of the silicide layer remains exposed to the via opening after forming the liner.

In some embodiments, the method further includes forming inner spacers vertically between a bottommost one of the semiconductor layers and the semiconductor strip, wherein the isolation layers are in contact with the inner spacers.

In some embodiments, the epitaxial layers are made of SiGe or SiGeB.

In some embodiments of the present disclosure, a method includes forming a semiconductor strip and semiconductor layers over a substrate, the semiconductor layers being vertically stacked over a front side of the semiconductor strip; forming isolation structures laterally surrounding the semiconductor strip; forming a gate structure over the semiconductor layers; etching the semiconductor strip to form recesses in the semiconductor strip and on opposite sides of the gate structure; forming epitaxial layers in the recesses, respectively; etching back the epitaxial layers until top surfaces of the epitaxial layer are lower than a top surface of the semiconductor strip; forming epitaxial source/drain structures over the epitaxial layers, respectively; grinding the substrate to expose the isolation structures; and forming a backside via extending through the semiconductor strip and one of the epitaxial layers, wherein the backside via is electrically connected to one of the epitaxial source/drain structures.

In some embodiments, the method further includes forming isolation layers over the epitaxial layers, respectively, wherein the isolation layers vertically separate the epitaxial layers from the epitaxial source/drain structures.

In some embodiments, the isolation layers are formed extending to top surfaces of the isolation structures.

In some embodiments, etching back the epitaxial layers is performed such that each of the epitaxial layers has a concave top surface.

In some embodiments, forming the backside via comprises forming a dielectric layer on a backside of the semiconductor strip; forming a via opening extending through the dielectric layer, the semiconductor strip, and the one of the epitaxial layers to expose the one of the epitaxial source/drain structures; and filling the via opening with a conductive material.

In some embodiments, the method further includes forming a silicide layer on an exposed surface of the one of the epitaxial source/drain structures through the via opening; and forming liner in the via opening and lining sidewalls of the epitaxial layers and the semiconductor strip.

In some embodiments, the semiconductor strip and the semiconductor layers are made of silicon, while the epitaxial layers are made of silicon germanium.

In some embodiments of the present disclosure, a semiconductor device includes a semiconductor strip. Semiconductor layers are vertically stacked over the semiconductor strip. A gate structure wraps each of the semiconductor layers. First and second epitaxial source/drain structures are on opposite sides of the gate structure. First and second isolation layers are below the first and second epitaxial source/drain structures, respectively. First and second epitaxial layers are below the first and second isolation layers, respectively. A backside via is in the semiconductor strip, the first epitaxial layer, and the first isolation layer, wherein the backside via is electrically connected to the first epitaxial source/drain structure.

In some embodiments, top surfaces of the first and second epitaxial layers are lower than a bottom surface of the gate structure.

In some embodiments, the semiconductor device further includes a silicide layer between first epitaxial source/drain structure and the backside via.

In some embodiments, the semiconductor device further includes a liner lining sidewalls of the backside via, wherein the liner and the backside via are both in contact with the silicide layer.

In some embodiments, the semiconductor device further includes isolation structures laterally surrounding the semiconductor strip, wherein the first and second isolation layers extend to top surfaces of the isolation structures.

In some embodiments, top surfaces of the first and second epitaxial layers are lower than the top surfaces of the isolation structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a semiconductor strip and semiconductor layers vertically stacked over a front side of the semiconductor strip;
forming a gate structure over the semiconductor layers;
etching the semiconductor strip to form recesses in the semiconductor strip and on opposite sides of the gate structure;
forming epitaxial layers in the recesses, respectively;
forming isolation layers over the epitaxial layers, respectively;
forming epitaxial source/drain structures over the isolation layers, respectively;
performing an etching process from a backside of the semiconductor strip to form a via opening extending through the semiconductor strip, one of the epitaxial layers, and one of the isolation layers, wherein one of the epitaxial source/drain structures is exposed through the via opening; and
forming a backside via in the via opening.

2. The method of claim 1, further comprising etching back the epitaxial layers such that top surfaces of the epitaxial layers are lower than a top surface of the semiconductor strip.

3. The method of claim 1, further comprising forming a dielectric layer on the backside of the semiconductor strip, wherein the etching process is performed to the dielectric layer and the via opening is formed in the dielectric layer.

4. The method of claim 1, further comprising forming a silicide layer on an exposed portion of the one of the epitaxial source/drain structures prior to forming the backside via.

5. The method of claim 4, further comprising forming a liner lining sidewalls of the via opening prior to forming the backside via, wherein a portion of the silicide layer remains exposed to the via opening after forming the liner.

6. The method of claim 1, further comprising forming inner spacers vertically between a bottommost one of the semiconductor layers and the semiconductor strip, wherein the isolation layers are in contact with the inner spacers.

7. The method of claim 1, wherein the epitaxial layers are made of SiGe or SiGeB.

8. A method, comprising:
forming a semiconductor strip and semiconductor layers over a substrate, the semiconductor layers being vertically stacked over a front side of the semiconductor strip;
forming isolation structures laterally surrounding the semiconductor strip;
forming a gate structure over the semiconductor layers;
etching the semiconductor strip to form recesses in the semiconductor strip and on opposite sides of the gate structure;
forming epitaxial layers in the recesses, respectively;
etching back the epitaxial layers until top surfaces of the epitaxial layers are lower than a top surface of the semiconductor strip;
forming epitaxial source/drain structures over the epitaxial layers, respectively;
grinding the substrate to expose the isolation structures; and
forming a backside via extending through the semiconductor strip and one of the epitaxial layers, wherein the backside via is electrically connected to one of the epitaxial source/drain structures.

9. The method of claim 8, further comprising forming isolation layers over the epitaxial layers, respectively, wherein the isolation layers vertically separate the epitaxial layers from the epitaxial source/drain structures.

10. The method of claim 9, wherein the isolation layers are formed extending to top surfaces of the isolation structures.

11. The method of claim 8, wherein etching back the epitaxial layers is performed such that each of the epitaxial layers has a concave top surface.

12. The method of claim 8, wherein forming the backside via comprises:
forming a dielectric layer on a backside of the semiconductor strip;
forming a via opening extending through the dielectric layer, the semiconductor strip, and the one of the epitaxial layers to expose the one of the epitaxial source/drain structures; and
filling the via opening with a conductive material.

13. The method of claim 12, further comprising:
forming a silicide layer on an exposed surface of the one of the epitaxial source/drain structures through the via opening; and
forming liner in the via opening and lining sidewalls of the epitaxial layers and the semiconductor strip.

14. The method of claim 8, wherein the semiconductor strip and the semiconductor layers are made of silicon, while the epitaxial layers are made of silicon germanium.

15. A semiconductor device, comprising:
a semiconductor strip;
semiconductor layers vertically stacked over the semiconductor strip;
a gate structure wrapping each of the semiconductor layers;
first and second epitaxial source/drain structures on opposite sides of the gate structure;
first and second isolation layers below the first and second epitaxial source/drain structures, respectively;
first and second epitaxial layers below the first and second isolation layers, respectively; and
a backside via in the semiconductor strip, the first epitaxial layer, and the first isolation layer, wherein the backside via is electrically connected to the first epitaxial source/drain structure.

16. The semiconductor device of claim 15, wherein top surfaces of the first and second epitaxial layers are lower than a bottom surface of the gate structure.

17. The semiconductor device of claim 15, further comprising a silicide layer between the first epitaxial source/drain structure and the backside via.

18. The semiconductor device of claim 17, further comprising a liner lining sidewalls of the backside via, wherein the liner and the backside via are both in contact with the silicide layer.

19. The semiconductor device of claim 15, further comprising isolation structures laterally surrounding the semiconductor strip, wherein the first and second isolation layers extend to top surfaces of the isolation structures.

20. The semiconductor device of claim 19, wherein top surfaces of the first and second epitaxial layers are lower than the top surfaces of the isolation structures.

* * * * *